Aug. 21, 1962 R. H. ROGERS ET AL 3,050,642

COMBINED SQUELCH CIRCUIT AND AMPLIFIER

Filed Aug. 3, 1959

INVENTORS
ROBERT H. ROGERS
ROBERT C. CARTER
BY Moody and Phillion
ATTORNEYS

United States Patent Office 3,050,642
Patented Aug. 21, 1962

3,050,642

COMBINED SQUELCH CIRCUIT AND AMPLIFIER

Robert H. Rogers and Robert C. Carter, Richardson, Tex., assignors to Collins Radio Company, Cedar Rapids, Iowa, a corporation of Iowa Filed Aug. 3, 1959, Ser. No. 831,353
2 Claims. (Cl. 307—88.5)

This invention relates generally to squelch circuits and more particularly to squelch circuits of the type having a positive, switch-like operation.

In certain types of electronic receiving equipment, such as radio receivers, for example, the signal-to-noise ratio sometimes decreases to a point where the intelligence becomes quite difficult to understand or even to the point where it is not understandable. It has been found that under such circumstances it frequently is desirable to eliminate all signals, including both noise and intelligence from the output stages of the receiver, during periods when the signal-to-noise ratio decreases below a certain value. The result is, in the case of a radio receiver, an audio signal which is devoid of garbled portions and of excessive noises. It is conceivable, however, that the signal-to-noise ratio could become bad enough so that quite considerable portions of the received signal would be eliminated, thus leaving an insufficient amount of undistorted audio signal to be understandable. However, in such a case the overall signal would, in the absence of a squelch circuit, be unintelligible anyway.

There are available in the prior art many different types of squelch circuits. In recent years some of these squelch circuits have employed transistors instead of vacuum tubes. One particular line of development of squelch circuits employing transistors uses two transistors, one of the transistors being utilized as an amplifier (in the audio circuit in the case of a radio receiver) and having the usual collector electrode, emitter electrode and base. A second transistor is employed as a part of the squelch circuit, the potential of the collector electrode of the second transistor being supplied to the base electrode of the first transistor to control the conductivity thereof. More specifically, when the second transistor is nonconductive the collector electrode thereof will be at a different potential than when said second transistor is conductive. The circuit parameters are so arranged that the collector potential of the conducting second transistor will tend to cut off said first transistor. Conversely, the collector potential of the nonconducting second transistor will cause said first transistor to be conductive. It is to be noted, however, that there is a range of collector potentials (of said second transistor) between nonconductivity and high conductivity, and as the collector potential passes through this range of potentials the conductivity of the first transistor will change correspondingly. In other words, the conductivity of the first transistor can be caused to change gradually as the conductivity of said second transistor is changed gradually. It can be seen, therefore, that if the conductivity of the second transistor is controlled, for example, by the magnitude of the automatic gain control voltage (AGC voltage) applied to its base and since the magnitude of an automatic gain controlled voltage usually varies gradually over a certain range, it follows that under certain circumstances the squelch circuit would not function to cut off the first transistor but would merely function to decrease somewhat the conductivity of the first transistor. This is not an entirely satisfactory situation inasmuch as the signal-to-noise ratio is not improved thereby, but rather the output audio signal is only partially decreased in volume.

It is to be noted that although the control voltage is described as an AGC voltage herein, such control voltage may be any suitable and desirable control voltage and is not limited to AGC voltage.

It is an object of the present invention to provide a squelch circuit employing transistors and which has a positive, switch-like action which functions to cut off the output signal abruptly when the signal-to-noise ratio decreases to a predetermined value.

Another object of the invention is to provide a squelch circuit employing feedback means whereby when the control voltage attains a certain magnitude the squelch circuit will switch from a substantially completely "off" position to a substantially completely "on" condition.

A third purpose of the invention is to provide a squelch circuit employing two transistors having a common emitter load whereby single input bistable operation is effected to produce conductivity in either of the transistors to the exclusion of conductivity in the other transistor.

A fourth aim of the invention is the improvement of squelch circuits generally.

In accordance with the invention there is provided a first transistor having its collector electrode connected to the first terminal of a battery source through a first impedance means and its emitter electrode connected to the other terminal of the battery source (which other terminal can be ground terminal potential) through a second impedance means. A voltage divider is connected from the first terminal to ground potential and has a tap thereon which is connected to the base electrode of the transistor to provide the proper bias for conductivity in said first transistor. Means are provided to supply an intelligence bearing signal to said base electrode which in turn will produce an amplified output signal at the collector electrode. Means are provided to utilize this output signal. A second transistor has its emitter electrode connected to a point on said second impedance means so that at least a portion of said second impedance is common to the emitter electrodes of said first and second transistors. The collector electrode of said second transistor is connected to a point between said tap and said first terminal of said battery means. Means are provided to bias the base electrode of said second transistor to a value a little below collector current cut-off value. Further, means are provided to supply the control voltage to said base electrode of said second transistor.

When the control voltage increases to a critical value (threshold value) the second transistor becomes conductive, thus by-passing a portion of said voltage divider, which results in a decrease of the potential at said tap with a consequent decrease of the potential on the base electrode of the first transistor. Such a decrease in base electrode potential will tend to cut off said first transistor. Further, the conductivity of said second transistor will cause an increased current flow through the common impedance means in the emitter circuit which will tend to increase the potential of the emitter of said first transistor, thus further insuring the cutting off of said first transistor. As soon as the first transistor begins to be nonconductive there will be corresponding decrease in the current flow through said common resistor which will make said second transistor more conductive. As can be seen, the process is regenerative, and will continue until the said first transistor is substantially completely cut off and the said second transistor is freely conductive. Under such circumstances, the intelligence bearing signal supplied to the base electrode of the first transistor will not appear in the output circuit thereof.

When the said control voltage decreases to the critical value the second transistor will begin to be nonconductive to cause an increase in the potential of the base of the first transistor and to cause a decrease in the potential of the emitter of the first transistor, thus causing the initiation of a current flow through said first transistor. The consequent increase in current flow through the common emitter impedance means will further hasten the cutting off of said second transistor due to the consequent tendency of the emitter potential to increase. Further cutting off of the second transistor will tend to cause the first transistor to become more conductive. Such process is regenerative and continues until the said second transistor is substantially completely cut off and said first transistor is freely conductive so that said intelligence bearing signal is amplified by said first transistor and appears in the output circuit thereof. Further, such process occurs almost instantaneously when the control voltage reaches the critical value.

In accordance with a feature of the invention the parameters of the circuit can be selected so that when the second transistor is nonconductive the bias applied to the base electrode of the first transistor will be of sufficient magnitude to cause said first transistor to operate as a class A amplifier.

The above mentioned and other objects and features of the invention will be more fully understood from the following description thereof when read in conjunction with the drawings, in which.

Figure 1:
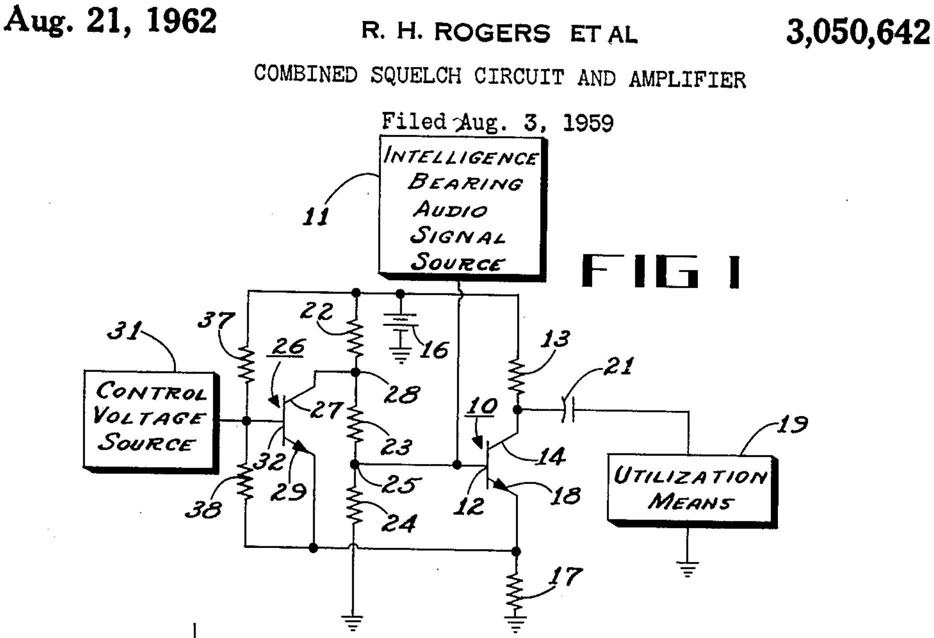
FIG. 1 is a schematic sketch of a preferred embodiment of the invention.

Referring to FIG. 1 transistor 10 functions as an amplifier for the output signal of audio signal of audio signal source 11, which output signal is supplied to the base 12 of transistor 10. Resistor 13 connects the collector 14 to the positive terminal of battery source 16. Common emitter resistor 17 connects the emitter electrode 18 to ground potential. The output of transistor 10 is supplied to utilization means 19 through coupling capacitor 21. Bias voltage for the base 12 of transistor 10 is supplied by means of the voltage divider comprised of resistors 22, 23, and 24, which divider has a tap 25 connecting the point between resistors 23 and 24 to base 12. The resistors 22, 23, and 24, and the other circuit constants are so proportioned that transistor 10 will operate as a class A amplifier when transistor 26 is nonconductive.

Transistor 26 has its collector electrode 27 connected to the junction 28 between resistors 22 and 23 and has its emitter 29 connected directly to the emitter 18 of transistor 10. It is to be noted that collector 27 could be connected directly to the positive terminal of battery 16 although the swiching time would be somewhat reduced thereby and such switching would be effected solely by means of the common emitter resistor 17 in such case. Resistors 37 and 38 form a voltage divider to bias the base 32 of transistor 26 about one volt below cut off. The control voltage source 31 is constructed to supply a control voltage to the base electrode 32 of transistor 26 to control the conductivity thereof. In one particular application of this invention the control voltage source 31 can be the AGC voltage in a radio receiver, for example, and for purposes of portions of the description of the present invention it will be assumed that the control voltage source is an AGC voltage. When the signal-to-noise ratio of the signal received by the receiver (not shown) is above a certain threshold value the AGC voltage is insufficient to raise the bias of transistor 26 above cut-off value. However, when the signal-to-noise ratio decreases to a point where the AGC voltage increases to just above cut-off value (the threshold value) the transistor 26 will respond rapidly thereto to become highly conductive and transistor 10 will respond to rapidly become nonconductive. To further explain this operation reference is made jointly to the curves of FIGS. 2 and 3 and the structure of FIG. 1. When the AGC voltage is less than the cut-off value (which, for purposes of discussion is assumed to be two volts) the transistor 26 will be in its cut-off position as shown by the portion 33 of the curve of FIG. 2 and the transistor 10 will be in its conductive condition as shown by the portion 40 of the curve of FIG. 3. Under these circumstances the intelligence hearing signal from source 11 will be amplified by transistor 10 and utilized by utilization means 19.

When the AGC voltage output reaches two volts the transistor 26 will begin to conduct, thus decreasing the resistance between point 28 and ground since an alternative circuit is therebetween established through transistor 26 and common emitter resistor 17. The increased current flow through resistor 22 will cause a decrease in the potential of point 28 and a corresponding decrease in the potential of tap 25 which is connected to base 12. Further, the current flow through transistor 26 and common resistor 17 will increase the potential of emitter 18. Both the decrease of the potential of base 12 and the increase of the potential of the emitter 18 will tend to cut off the transistor 10. However, any decrease in the emitter current of transistor 10 will be reflected as a decrease in the voltage across resistor 17, thus causing the transistor 26 to be more conductive. As indicated hereinbefore, this is a regenerative process and continues until resistor 26 is highly conductive as shown by portion 34 of the curve of FIG. 2 and transistor 10 is substantially nonconductive. Under the conditions just mentioned the intelligence bearing signal from source 11 will not be amplified by transistor 10 and will not appear in the output (collector) circuit of transistor 10. It is to be understood that when it is stated herein that a decrease in the current flow through the emitter of transistor 10 will be reflected as a decrease in voltage across resistor 17, it is not meant necessarily that the overall potential drop across resistor 17 has been decreased. It simply means that the voltage drop across resistor 17 due to the decrease in current flow through the emitter of transistor 10 has been decreased. As a matter of fact, the voltage drop across resistor 17 might actually be increased if the increase in current flow therethrough from transistor 26 exceeds the decrease in current flow therethrough from transistor 10. Similarly, when it is stated that an increase or decrease of current flow through transistor 26 will result in an increase or decrease of potential drop across resistor 17, it is meant that only that component of voltage due to the current flow through resistor 17 from transistor 26 is being considered.

Figure 2:
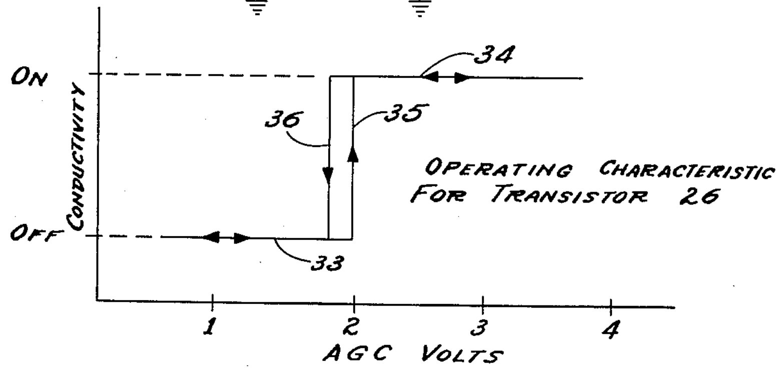
FIG. 2 shows a curve of the operating characteristic of one of the two transistors.
Figure 3:
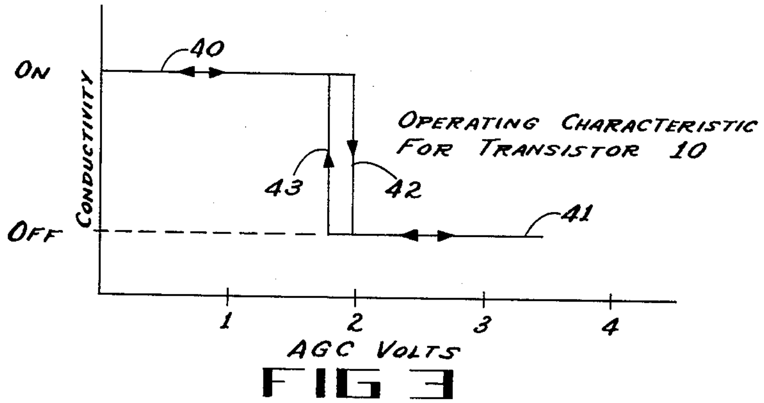
FIG. 3 shows a curve of the operating characteristic of the other of the two transistors.

It can be seen from the curves of FIGS. 2 and 3 that there is a hysteresis effect in the operation of the circuit. More specifically, when the transistor 26 switches from "off" condition as represented by the portion 33 of the curve to the "on" position represented by the portion 34 of the curve, such transition will occur at the two volt level as indicated by the portion 35 of the curve. However, the transition from "on" condition to "off" condition will occur at a biasing voltage level less than 2 volts as indicated by the portion 26 of the curve of FIG. 2, such hysteresis effect is comparatively small and can be easily made to be less than one db, i.e., the difference in voltage levels of curve portions 36 and 35 can be made to be less than one db.

The switching of transistor 10 between "on" and "off" positions occurs almost simultaneously with the switching of transistor 26 between "on" and "off" positions. It is to be noted specifically that when transistor 26 is switched to its "on" position, transistor 10 is switched to its "off" position and when transistor 26 is switched to its "off" position transistor 10 is switched to its "on" position. Such relationship is readily apparent by a comparison of the curves of FIGS. 2 and 3 which have a common control voltage scale for their abscissas. As indicated hereinbefore, the curve of FIG. 3 shows the operating characteristics of transistor 10, and specifically, the portion 42 shows the transitional characteristic from "on" condition to "off" condition, and portion 43 shows the transitional characteristic from "off" position to "on" position.

In accordance with one preferred embodiment of the invention, the following circuit parameters may be employed:

| | |
|---|---|
| Resistor **38** | 18K |
| Resistor **37** | 306K |
| Resistor **22** | 10K |
| Resistor **23** | 56K |
| Resistor **24** | 10K |
| Resistor **13** | 10K |
| Resistor **17** | 1.8K |
| Voltage **16** ______volts | 18 |

Transistors 26 and 10 may be of the type 905.

With the above circuit constants the voltage on base 32 is about .93 volt, and with no control voltage applied to base 32 (i.e., transistor 26 nonconducting) the voltage on emitter 29 is about 1.77 volts, the voltage on collector 27 is about 15.6 volts, the voltage on base 12 of transistor 10 is about 2,37 volts, and the voltage on collector 14 is about 8.18 volts. It will be observed that under these circumstances the potential of base 12 of transistor 10 is more positive than the potential of the emitter electrode 18, which is connected directly to emitter electrode 29 of transistor 26.

When the control voltage reaches a value of 2 volts (and transistor 26 becomes conductive and transistor 10 becomes nonconductive) the voltage on the base 32 will be about 2.93 volts, the voltage on collector electrode 28 will be about 4.8 volts, and the voltage on emitter 29 will be about 2.35 volts. In the case of transistor 10 the voltage on the emitter electrode 18 will be 2.35 volts, the voltage on the base 12 will be about .74 volt, and the voltage on collector electrode 14 will be about 18 volts. It will be noted that with this set of operating conditions the potential of the base 12 is less than that of emitter 18, which will cause transistor 10 to be nonconductive.

It is to be understood that the form of the invention shown and described herein is but one preferred embodiment thereof and that various changes may be made in circuit arrangement and in the value of circuit constants without departing from the spirit or scope of the invention.

We claim:

1. An electronic switch comprising first transistor means including first base means, first collector means, and first emitter means, battery means comprising first and second terminals, first impedance means connecting said first emitter means to said first terminal, load impedance means connecting said first collector means to said second terminal, means for supplying an intelligence bearing signal to said first base means, means for utilizing the signal appearing at said first collector means, voltage divider means connected across said first and second terminals of said battery means, a tap on said voltage divider means connected to first base means, second transistor means including second collector means connected to a point along said voltage divider means between said tap and said second terminal, second emitter means connected to said first emitter means, and second base means, biasing means for biasing said second base means, said biasing means constructed to be substantially independent of voltage variation across said load impedance means, and means for supplying a control signal to said second base means, said second transistor means constructed to respond to said control signal to become conductive when said control signal reaches a predetermined value and to become nonconductive when said control signal reaches a second predetermined value, said first impedance, said load impedance, voltage divider means, and said battery means being constructed and arranged to cause said first transistor means to be nonconductive when said second transistor means is conductive and to cause said first transistor means to become conductive when said second transistor means is nonconductive.

2. In an electronic receiving apparatus comprising means for producing an AGC voltage, squelch circuit means comprising first transistor means including first base means, first collector means, and first emitter means, battery means having first and second terminals, first resistor means connecting said emitter means to a first terminal of said battery means, load resistor means connecting said collector means to the second terminal of said battery means, means for supplying an input signal to said first base means, means for utilizing the signal appearing at said collector means, voltage divider means connected across said battery means, a tap on said voltage divider means connected to said first base means, second transistor means including second collector means connected to a point along said voltage divider means between said tap and the second terminal of said battery source, second emitter means connected to said first emitter means, and second base means, biasing means for biasing said second base means, said biasing means constructed to be substantially independent of voltage variation across said load resistor means, and means for supplying said AGC voltage to said second base means, said first resistor means, said voltage divider means, and said battery means being constructed and arranged to cause said first transistor to be nonconductive when said second transistor is conductive and to cause said first transistor to be conductive when said second transistor is nonconductive.

References Cited in the file of this patent

UNITED STATES PATENTS

| | | |
|---|---|---|
| 2,704,324 | Broadhead | Mar. 15, 1955 |
| 2,706,776 | MacMullan et al. | Apr. 19, 1955 |
| 2,829,257 | Root | Apr. 1, 1958 |
| 2,888,527 | Follensbee et al. | May 26, 1959 |
| 2,888,579 | Wanlass | May 26, 1959 |
| 2,914,711 | Rosen | Nov. 24, 1959 |

OTHER REFERENCES

"Pulse and Digital Circuits," by Millman and Taub, McGraw-Hill, 1956, pages 164–171.